United States Patent
Huang (10) Patent No.: US 11,539,164 B2
(45) Date of Patent: Dec. 27, 2022

(54) ELECTRONIC DEVICE WITH CAPABILITY OF LEVER EJECTION AND LEVER MECHANISM THEREOF

(71) Applicant: Moxa Inc., New Taipei (TW)

(72) Inventor: Yi-Chiao Huang, New Taipei (TW)

(73) Assignee: Moxa Inc., New Taipei (TW)

( * ) Notice: Subject to any disclaimer, the term of this patent is extended or adjusted under 35 U.S.C. 154(b) by 333 days.

(21) Appl. No.: 16/932,856

(22) Filed: Jul. 20, 2020

(65) Prior Publication Data

US 2021/0242628 A1 Aug. 5, 2021

(30) Foreign Application Priority Data

Feb. 4, 2020 (TW) .................................. 109103289

(51) Int. Cl.
*H05K 7/14* (2006.01)
*H01R 13/629* (2006.01)
*H05K 7/18* (2006.01)

(52) U.S. Cl.
CPC ..... *H01R 13/62938* (2013.01); *H05K 7/1401* (2013.01); *H05K 7/183* (2013.01)

(58) Field of Classification Search
CPC combination set(s) only.
See application file for complete search history.

(56) References Cited

U.S. PATENT DOCUMENTS

| 6,186,804 | B1 | 2/2001 | Smith |
| 6,288,902 | B1 | 9/2001 | Kim |
| 6,406,312 | B1 | 6/2002 | Heitkamp |
| 7,907,414 | B1 | 3/2011 | Tamarkin |
| 8,531,847 | B2 * | 9/2013 | Chang ................ H01R 12/7029 361/755 |
| 10,674,620 | B2 * | 6/2020 | Chia .................... H05K 5/0291 |
| 2002/0178538 | A1 | 12/2002 | Matsushita |
| 2003/0137811 | A1 | 7/2003 | Ling |
| 2003/0223201 | A1 | 12/2003 | Son |
| 2005/0026464 | A1 | 2/2005 | Chiou |

(Continued)

FOREIGN PATENT DOCUMENTS

| CN | 1615677 A | 5/2005 |
| CN | 101196768 A | 6/2008 |

(Continued)

*Primary Examiner* — Anthony Q Edwards
*Assistant Examiner* — Hung Q Dang
(74) *Attorney, Agent, or Firm* — Winston Hsu (57) ABSTRACT

An electronic device includes a case module, a circuit board, a detachable module and a lever mechanism. The detachable module is detachably installed on the case module and slidable relative to the case module, and an electrical connector of the detachable module is mated with a mating electrical connector of the circuit board when the detachable module is installed on the case module and slides to an engaging position. The lever mechanism includes a lever component partially located between the case module and the detachable module, and an abutting component fixed on the case module. When the lever component is operated to pivot relative to the detachable module, the lever component cooperates with the abutting component in a contacting manner to drive the detachable module to slide, so as to disengage the electrical connector of the detachable module from the mating electrical connector of the circuit board.

20 Claims, 10 Drawing Sheets

(56) References Cited

U.S. PATENT DOCUMENTS

| | | |
|---|---|---|
| 2005/0190544 A1 | 9/2005 | Chen |
| 2011/0042985 A1 | 2/2011 | Peng |
| 2012/0097623 A1 | 4/2012 | Zhang |
| 2013/0149028 A1 | 6/2013 | Bollenbach |
| 2017/0251560 A1 | 8/2017 | Spencer |

FOREIGN PATENT DOCUMENTS

| | | | |
|---|---|---|---|
| CN | 102455754 A | | 5/2012 |
| CN | 203025621 U | * | 6/2013 |
| CN | 203025621 U | | 6/2013 |
| CN | 205091666 U | | 3/2016 |
| CN | 110065021 A | | 7/2019 |
| TW | 201228143 A1 | | 7/2012 |
| TW | M452368 U1 | | 5/2013 |
| WO | 2016/081040 A1 | | 5/2016 |

* cited by examiner

ELECTRONIC DEVICE WITH CAPABILITY OF LEVER EJECTION AND LEVER MECHANISM THEREOF

BACKGROUND OF THE INVENTION

1. Field of the Invention

The present invention relates to an electronic device with capability of ejection of a detachable module, and an ejection mechanism thereof, and more specifically, to an electronic device with capability of lever ejection of a detachable module, and a lever mechanism thereof.

2. Description of the Prior Art

In order to satisfy different requirements in different application fields, modularity has gradually become a mainstream trend of electronic devices. Currently, a modular electronic device usually includes a case and at least one detachable module installed on the case. For example, a detachable hard disk drive is one of the common detachable modules. A detachable module is usually equipped with a handle for a user to grab. When it is desired to withdraw or remove such detachable module, the user can grab the handle to pull the detachable module by overcoming a mating force between an electrical connector of the detachable module and an electrical connector of a circuit board. However, it is not easy to withdraw or remove the detachable module due to the large mating force between the two electrical connectors. Furthermore, there is another modular electronic device equipped with an ejecting mechanism. The ejecting mechanism is used to eject the detachable module for easy removal of the detachable module. However, the conventional ejecting mechanism has complicated structure and affects an outward appearance and an internal space arrangement, which causes negative influences on the overall aesthetic appearance and miniaturization and thinning of the electronic device. Therefore, there is a need to provide an improved electronic device and an improved related mechanism.

SUMMARY OF THE INVENTION

Therefore, it is an objective of the present invention to provide an electronic device with capability of lever ejection and a related lever mechanism for solving the aforementioned problem.

In order to achieve the aforementioned objective, the present invention discloses an electronic device with capability of lever ejection. The electronic device includes a case module, at least one circuit board, at least one detachable module and at least one lever mechanism. The at least one circuit board is installed on the case module. The at least one detachable module is detachably installed on the case module and slidable relative to the case module to an engaging position along a first direction. An electrical connector of the at least one detachable module is mated with an mating electrical connector of the at least one circuit board when the at least one detachable module is located at the engaging position. The at least one lever mechanism is for driving the at least one detachable module to slide relative to the case module along a second direction opposite to the first direction. The at least one lever mechanism includes a lever component and an abutting component. The lever component includes an operating portion, an abutting portion and a pivoting portion. The operating portion is exposed out of a front side of the at least one detachable module. The abutting portion is located between the at least one detachable module and the case module. The pivoting portion is fixedly connected to the operating portion and the abutting portion and located between the operating portion and the abutting portion. The pivoting portion is pivotally disposed on a lateral side of the at least one detachable module adjacent to the front side of the at least one detachable module. The abutting component is fixed on the case module and located at a position corresponding to the abutting portion for abutting against the abutting portion. When the operating portion of the lever component is operated to drive the lever component to pivot relative to the at least one detachable module along a first pivoting direction, the abutting portion abuts against the abutting component to drive the at least one detachable module to slide along the second direction to a disengaging position, so that the electrical connector of the at least one detachable module is disengaged from the mating electrical connector of the at least one circuit board.

According to an embodiment of the present invention, the at least one lever mechanism further includes a lateral plate component disposed on the lateral side of the at least one detachable module, and the lever component is pivoted to the lateral plate component.

According to an embodiment of the present invention, the at least one lever mechanism further includes a resilient component, and two ends of the resilient component are respectively connected to the lever component and the lateral plate component to provide a resilient force to drive the lever component to pivot along the first pivoting direction continuously after the lever component pivots along the first pivoting direction over a predetermined degree.

According to an embodiment of the present invention, the electronic device further includes at least one guiding component fixed on the case module and located at a position corresponding to the lateral plate component. The lateral plate component slidably cooperates with the at least one guiding component to guide the at least one detachable module to slide relative to the case module along the first direction or the second direction.

According to an embodiment of the present invention, the electronic device further includes at least one guiding component fixed on the case module and located at a position corresponding to the lateral plate component. The lateral plate component slidably cooperates with the at least one guiding component to guide the at least one detachable module to slide relative to the case module along the first direction or the second direction.

According to an embodiment of the present invention, the lever component is pivoted to the at least one detachable module.

According to an embodiment of the present invention, the at least one lever mechanism further includes a resilient component, and two ends of the resilient component are respectively connected to the lever component and the at least one detachable module.

According to an embodiment of the present invention, the operating portion, the abutting portion and the pivoting portion are integrally formed.

According to an embodiment of the present invention, a straight line distance between the pivoting portion and the abutting portion is less than a straight line distance between the pivoting portion and the operating portion.

According to an embodiment of the present invention, a straight line distance between the pivoting portion and the abutting portion is less than a straight line distance between the pivoting portion and the operating portion.

In order to achieve the aforementioned objective, the present invention further discloses a lever mechanism adapted fora detachable module detachably installed on a case module. The detachable module is slidable relative to the case module along a first direction to an engaging position. An electrical connector of the detachable module is mated with a mating electrical connector of a circuit board installed on the case module. The lever mechanism includes a lever component and an abutting component. The lever component includes an operating portion, an abutting portion and a pivoting portion. The operating portion is exposed out of a front side of the detachable module. The abutting portion is located between detachable module and the case module. The pivoting portion is fixedly connected to the operating portion and the abutting portion and located between the operating portion and the abutting portion. The pivoting portion is pivotally disposed on a lateral side of the detachable module adjacent to the front side of the detachable module. The abutting component is fixed on the case module and located at a position corresponding to the abutting portion for abutting against the abutting portion. When the operating portion of the lever component is operated to drive the lever component to pivot relative to the detachable module along a first pivoting direction, the abutting portion abuts against the abutting component to drive the detachable module to slide along the second direction to a disengaging position, so that the electrical connector of the detachable module is disengaged from the mating electrical connector of the circuit board.

In summary, the present invention utilizes the lever component partially exposed out of the front side of the detachable module and partially located between the detachable module and the case module to abut against the abutting component for driving the electrical connector of the detachable module to disengage from the mating electrical connector of the circuit board. During the aforementioned operation, a resistance arm, i.e., the straight line distance between the pivoting portion and the abutting portion, is less than a force arm, i.e., the straight line distance between the pivoting portion and the operating portion, and the resilient component can provide the resilient force to drive the lever component to pivot along the first pivoting direction continuously after the lever component pivots along the first pivoting direction over the predetermined degree. Therefore, the present invention has advantages of easy and effort-saving operation. Besides, the present invention has simple structure, which does not affect the outward appearance and internal space arrangement, and therefore the present invention has an enhanced overall aesthetic appearance and facilitates miniaturization and thinning of the electronic device. Furthermore, during assembly of the detachable module, it is not required to operate the lever component, which brings convenience in use.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the preferred embodiments, reference is made to the accompanying drawings which form a part hereof, and in which is shown by way of illustration specific embodiments in which the invention may be practiced. In this regard, directional terminology, such as "top," "bottom," "front," "back," etc., is used with reference to the orientation of the Figure (s) being described. The components of the present invention can be positioned in a number of different orientations. As such, the directional terminology is used for purposes of illustration and is in no way limiting. Accordingly, the drawings and descriptions will be regarded as illustrative in nature and not as restrictive. Also, the term "couple" is intended to mean either an indirect or direct electrical/mechanical connection. Thus, if a first device is coupled to a second device, that connection may be through a direct electrical/mechanical connection, or through an indirect electrical/mechanical connection via other devices and connections.

Figure 1:
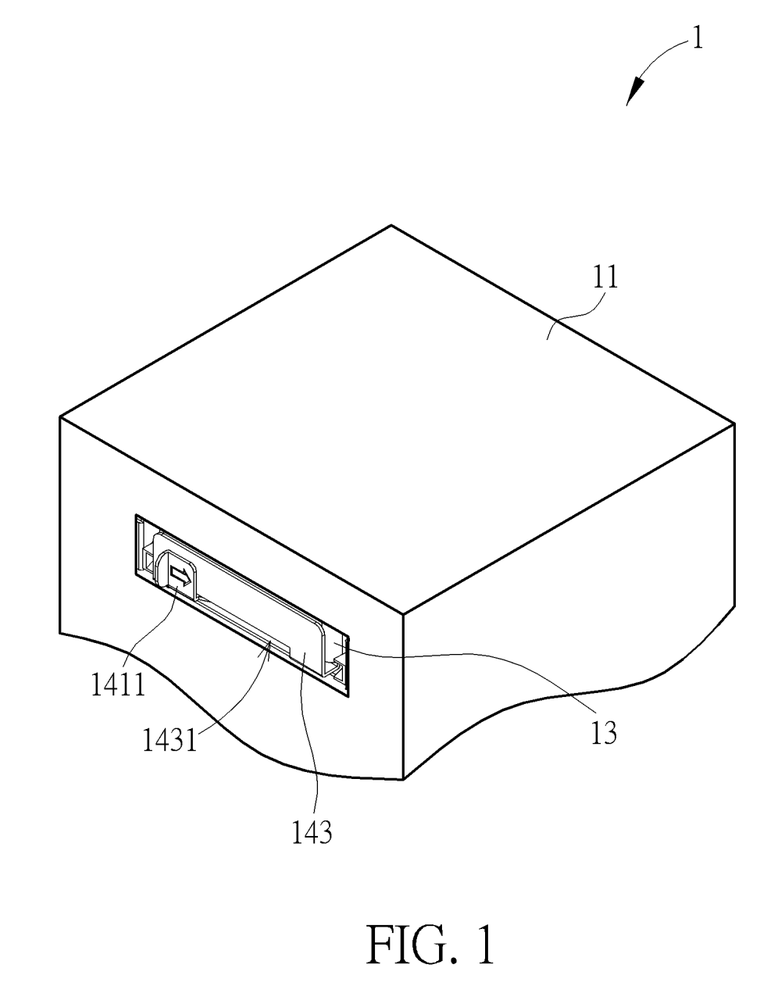
FIG. 1 is a partial schematic diagram of an electronic device according to an embodiment of the present invention.
Figure 2:
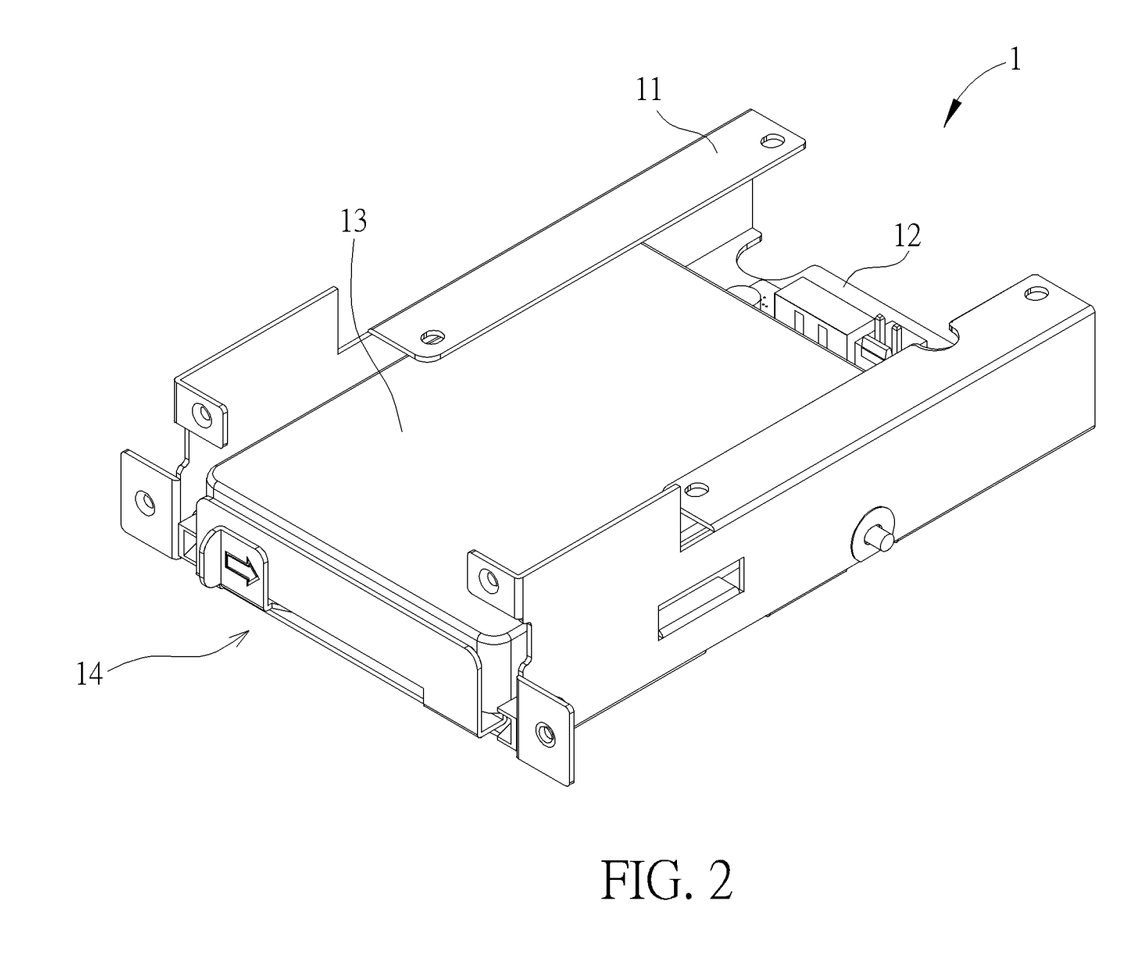
FIG. 2 is a partial internal structural diagram of the electronic device according to the embodiment of the present invention.
Figure 3:
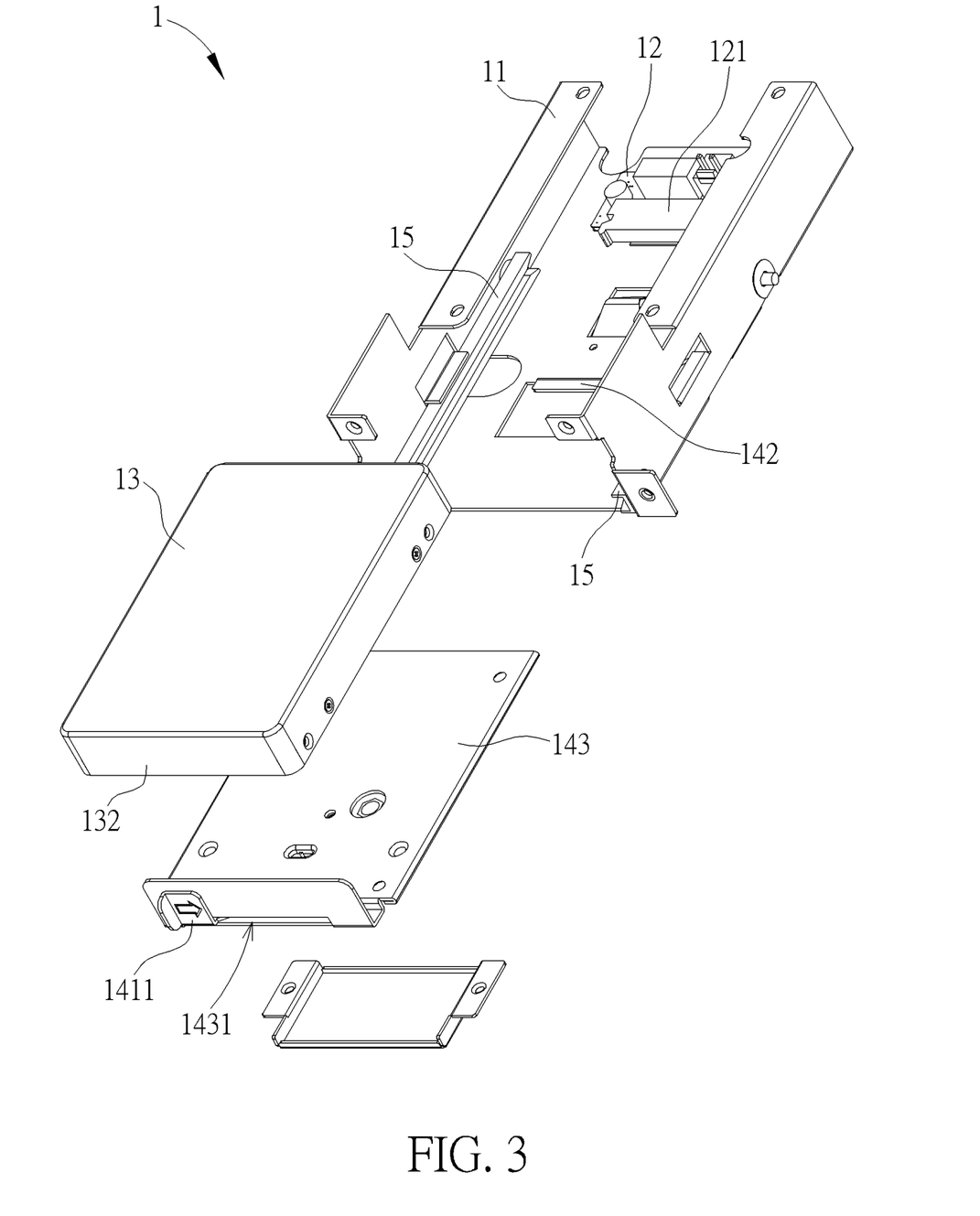
FIG. 3 to FIG. 5 are partial exploded diagrams of the electronic device at different views according to the embodiment of the present invention.
Figure 4:
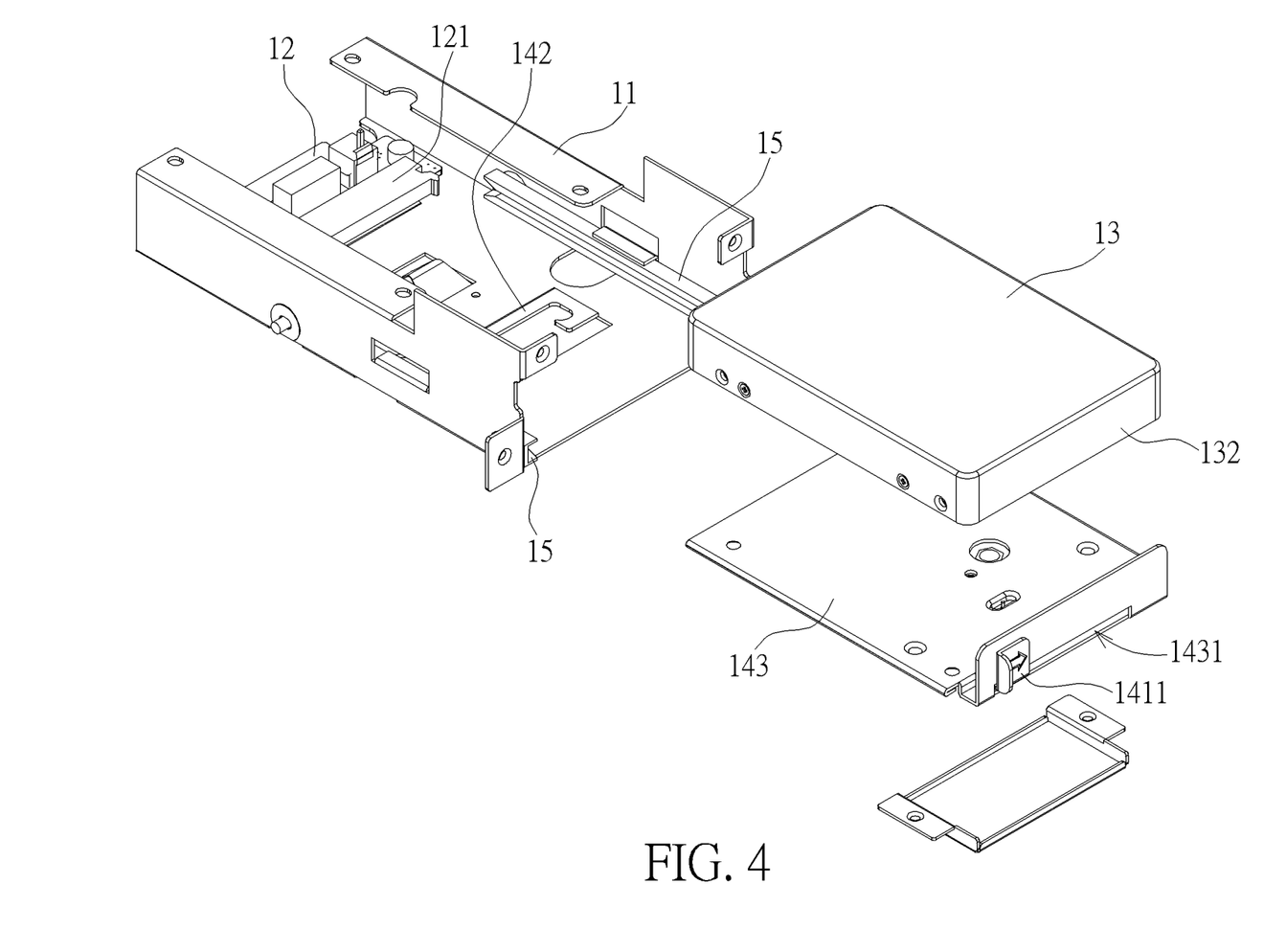
Figure 5:
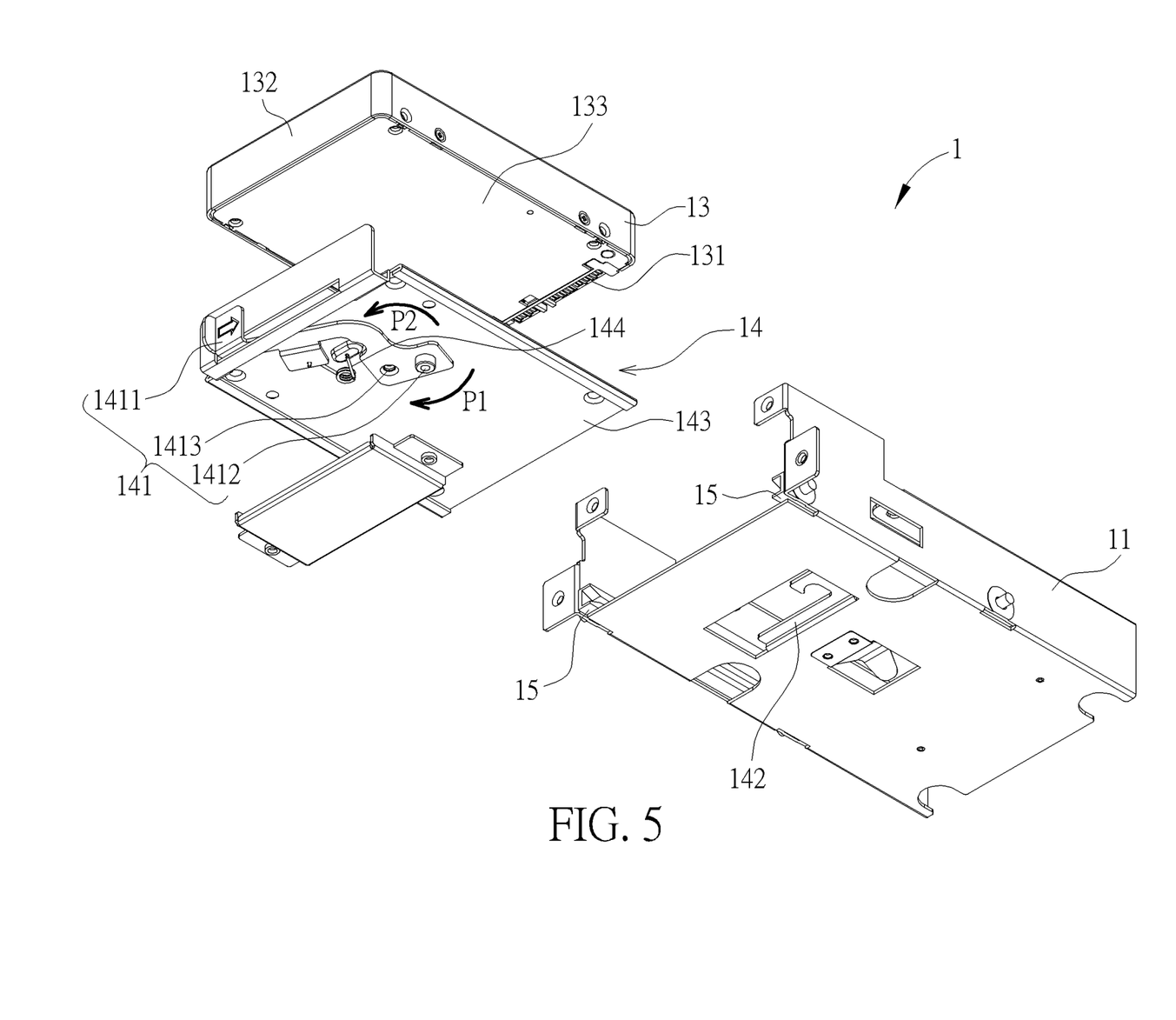
Figure 6:
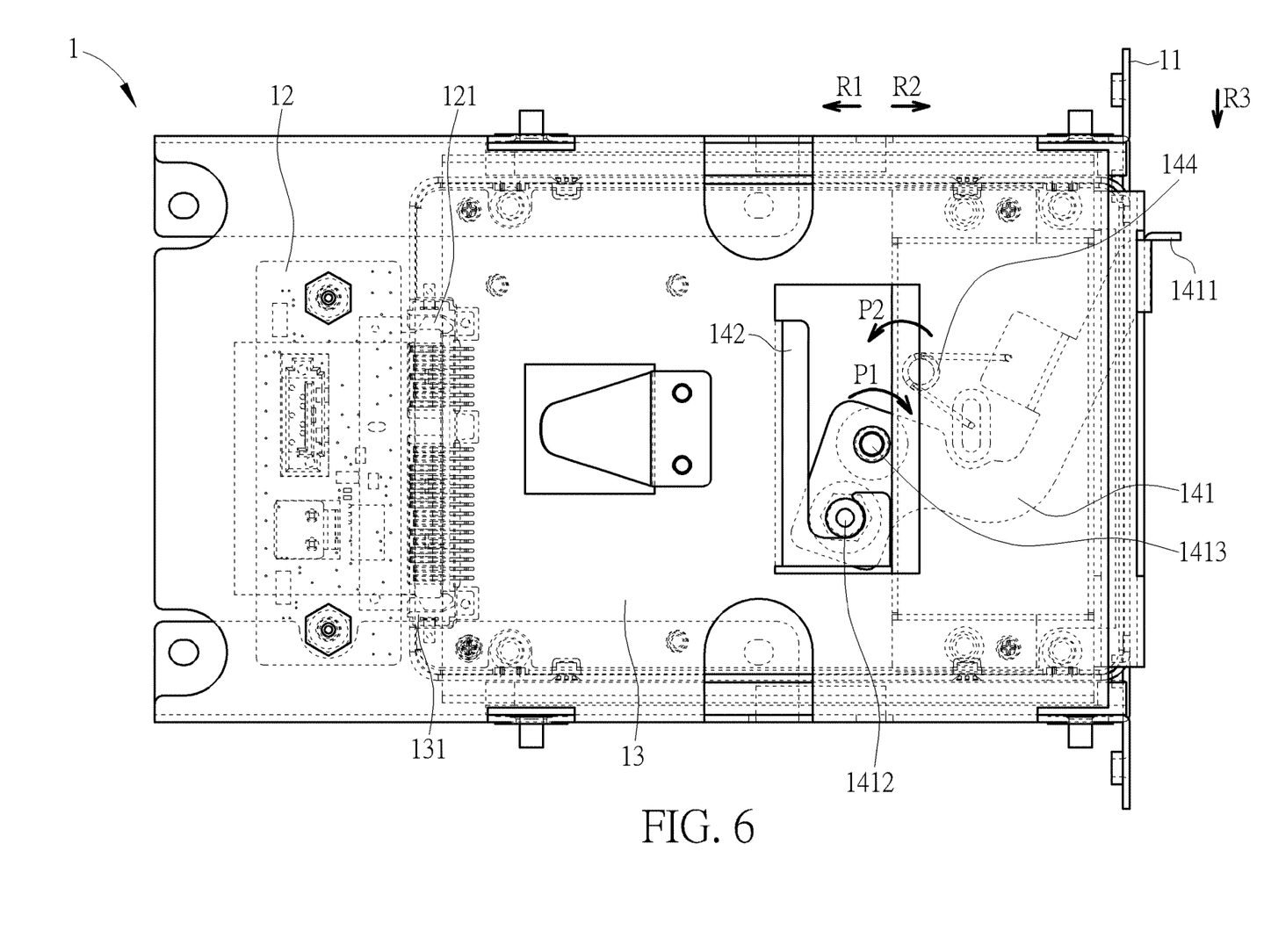
FIG. 6 to FIG. 10 are diagrams of the electronic device in different states according to the embodiment of the present invention.
Figure 7:
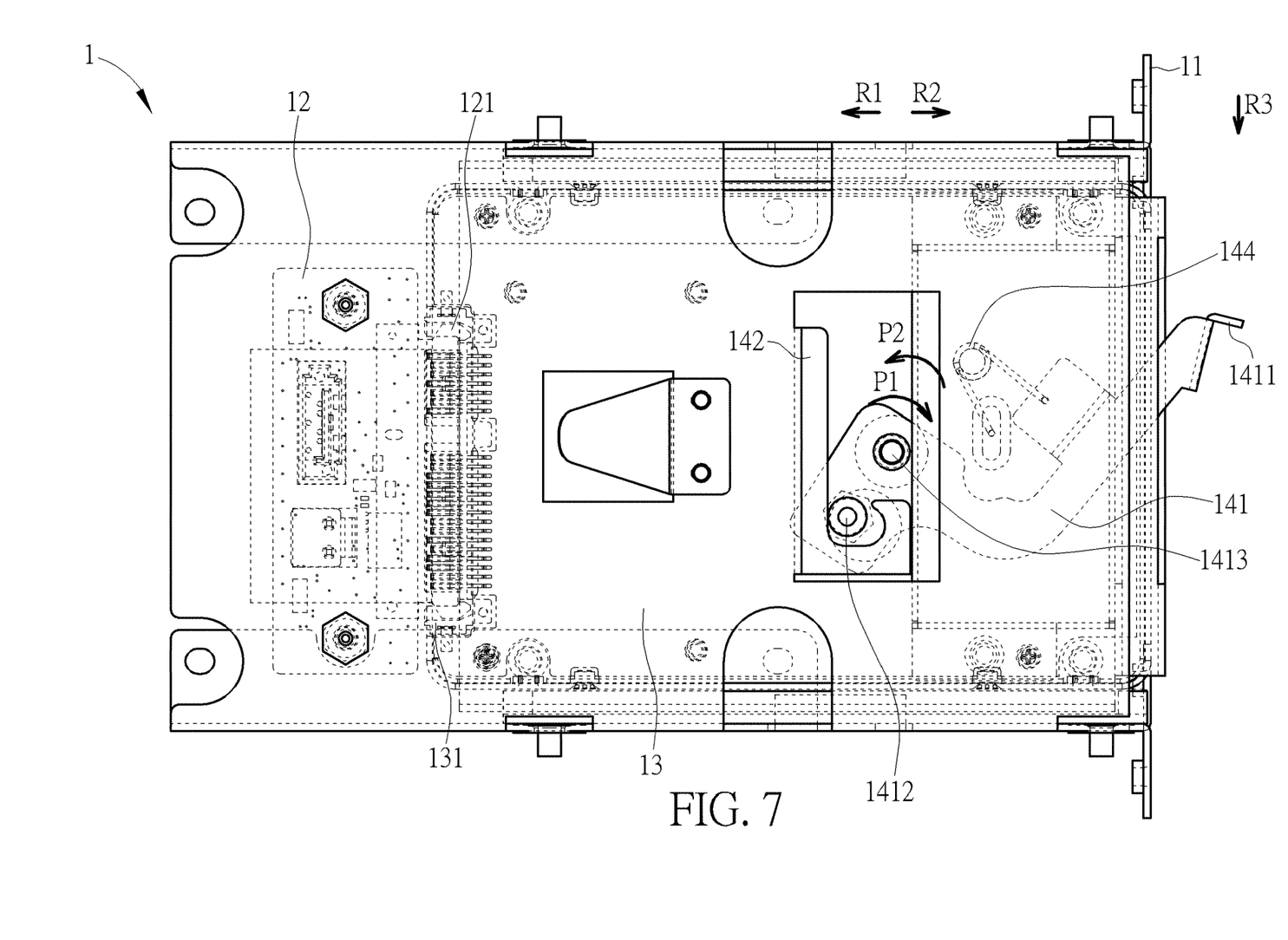
Figure 8:
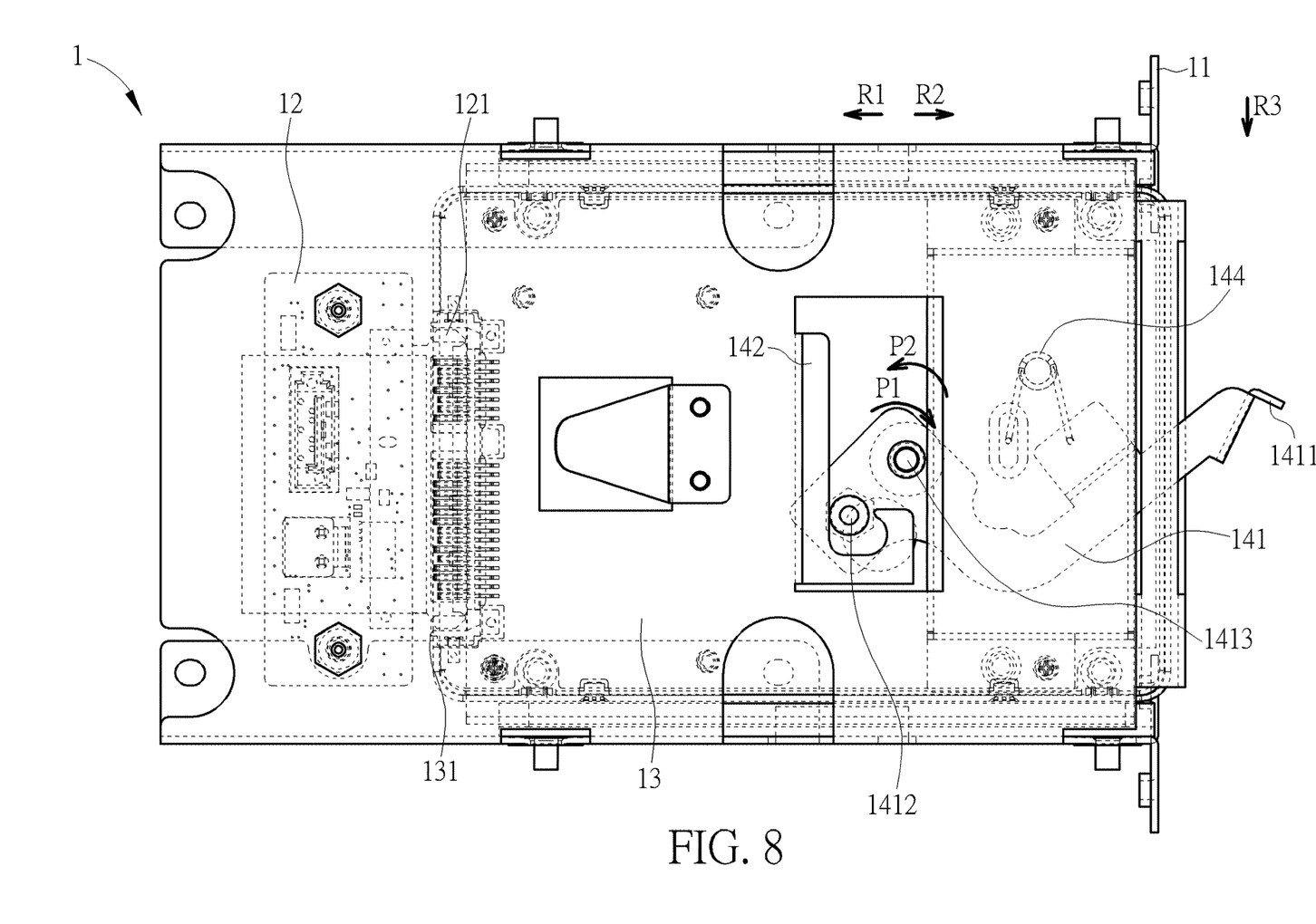

Please refer to FIG. 1 to FIG. 10. FIG. 1 is a partial schematic diagram of an electronic device 1 according to an embodiment of the present invention. FIG. 2 is a partial internal structural diagram of the electronic device 1 according to the embodiment of the present invention. FIG. 3 to FIG. 5 are partial exploded diagrams of the electronic device 1 at different views according to the embodiment of the present invention. FIG. 6 to FIG. 10 are diagrams of the electronic device 1 in different states according to the embodiment of the present invention. As shown in FIG. 1 to FIG. 10, the electronic device 1 includes a case module 11, a circuit board 12, a detachable module 13 and a lever mechanism 14. In order to clearly illustrate structure and operation of the present invention, FIG. 2 to FIG. 10 only show a bracket of the case module 11, which is for accommodating and/or supporting the circuit board 12, the detachable module 13 and the lever mechanism 14. The electronic device 1 can be a computer device, such as an industrial computer or a network host. The circuit board 12 is installed on the case module 11 and includes a mating electrical connector 121. The detachable module 13 is detachably installed on the case module 11 and slidable relative to the case module 11 along a first direction R1 to an engaging position as shown in FIG. 6, or along a second direction R2 opposite to the first direction R1 to a disengaging position as shown in FIG. 8. When the detachable module 13 is located at the engaging position as shown in FIG. 6, an electrical connector 131 of the detachable module 13 is mated with the mating electrical connector 121 of the circuit board 12. When the detachable module 13 is located at the disengaging position as shown in FIG. 8, the electrical connector 131 of the detachable module 13 is disengaged from the mating electrical connector 121 of the circuit board 12

The lever mechanism 14 can be operated by a user to drive the detachable module 13 to slide relative to the case module 11 along the second direction R2 for ejecting the detachable module 13. The lever mechanism 14 includes a lever component 141 and an abutting component 142. The lever component 141 includes an operating portion 1411, an abutting portion 1412 and a pivoting portion 1413. The operating portion 1411 is exposed out of a front side 132 of the detachable module 13. The operating portion 1411 can be formed in an L-shaped structure, and a portion of the L-shaped structure protruding outwardly can be operated by the user. The abutting portion 1412 is located between the detachable module 13 and the case module 11. The pivoting portion 1413 is fixedly connected to the operating portion 1411 and the abutting portion 1412 and located between the operating portion 1411 and the abutting portion 1412. The pivoting portion 1413 is pivotally disposed on a lateral side 133 of the detachable module 13 adjacent to the front side 132 of the detachable module 13. Preferably, in this embodiment, the lateral side 133 of the detachable module 13 can be a bottom side of the detachable module 13. The abutting component 142 is fixed on the case module 11 and located at a position corresponding to the abutting portion 1412 to abut against the abutting portion 1412. When the operating portion 1411 of the lever component 141 is operated to drive the lever component 141 to pivot relative to the detachable module 13 along a first pivoting direction P1, the abutting portion 1412 abuts against the abutting component 142 to drive the detachable module 13 to slide along the second direction to the disengaging position for disengaging the electrical connector 131 of the detachable module 13 from the mating electrical connector 121 of the circuit board 12.

Preferably, in this embodiment, the detachable module 13 can be a detachable hard disk drive. However, the present invention is not limited thereto. Furthermore, the numbers of the circuit board, the detachable module and the lever mechanism are not limited to this embodiment. It depends on practical demands. For example, in another embodiment, the electronic device also can include a plurality of circuit boards, a plurality of detachable modules and a plurality of lever mechanisms.

Specifically, as shown in FIG. 2 to FIG. 5, in this embodiment, the operating portion 1411, the abutting portion 1412 and the pivoting portion 1413 can be integrally formed. The lever mechanism 14 further includes a lateral plate component 143. The lateral plate component 143 is disposed on the lateral side 133 of the detachable module 13. The lever component 141 is pivoted to the lateral plate component 143. The lateral plate component 143 is bent from the lateral side 133 of the detachable module 13 toward the front side of the detachable module 13, and a notch 1431 is formed on a bending portion of the lateral plate component 143. The operating portion 1411 of the lever component 141 passes through the notch 1431 to be exposed out of the front side 132 of the detachable module 13 for allowing the user to operate.

Besides, the electronic device 1 further includes two guiding components 15 fixed on the bracket of the case module 11 and located at positions corresponding to the lateral plate component 143. The lateral plate component 143 slidably cooperates with the two guiding components 15 to guide a sliding movement of the detachable module 13 relative to the case module 11 along the first direction R1 or the second direction R2.

However, the number of the guiding component is not limited to this embodiment. For example, in another embodiment, the electronic device can include only one guiding component fixed on the case module.

Furthermore, in this embodiment, in order to allow the user to operate the lever component 141 to disengage the electrical connector 131 of the detachable module 13 from the mating electrical connector 121 of the circuit board 12 with effort-saving operation and more convenience, a straight line distance between the pivoting portion 1413 and the abutting portion 1412 can be less than a straight line distance between the pivoting portion 1413 and the operating portion 1411, so as to achieve the effort-saving operation by a lever configuration of that a resistance arm between the pivoting portion 1413 and the abutting portion 1412 is less than a force arm between the pivoting portion 1413 and the operating portion 1411. Furthermore, the lever mechanism 14 can further include a resilient component 144. Two ends of the resilient component 144 are respectively connected to the lever component 141 and the lateral plate component 143. The resilient component 144 can fix a position of the lever component 141 when the lever mechanism 14 is not operated, and the resilient component 144 further can provide a resilient force to drive the lever component 141 to pivot along the first pivoting direction P1 continuously after the lever component 141 pivots along the first pivoting direction P1 over a predetermined degree. In other words, the user can release the lever component 141 to allow the resilient component 144 to drive the lever component 141 to pivot along the first pivoting direction P1 continuously after the user operates the lever component 141 to pivot along the first pivoting direction P1 over the predetermined degree. Therefore, it is not required for the user to operate the lever component 141 during a whole pivoting movement of the lever component 141 along the first pivoting direction P1, which is convenient and user-friendly.

Preferably, in this embodiment, the resilient component 144 can be a torsional spring. However, the present invention is not limited to thereto.

The operation of the present invention is provided as follows. When it is desired to detach the detachable module 13 from the case module 11, the user can push the operating portion 1411 of the lever component 141 along a third direction R3 to drive the lever component 141 to pivot relative to the detachable module 13 along the first pivoting direction P1. When the lever component 141 pivots from a position shown in FIG. 6 to a position shown in FIG. 7 along the first pivoting direction P1, the abutting portion 1412 abuts against the abutting component 142. Afterwards, when the lever component 141 continuously pivots from the position shown in FIG. 7 to a position shown in FIG. 8 along the first pivoting direction P1, the lever component 141, the lateral plate component 143 and the detachable module 13 can be driven together by abutment of the abutting portion 1412 and the abutting component 142 to slide along the second direction R2 to the disengaging position, so as to disengage the electrical connector 131 of the detachable module 13 from the mating electrical connector 121 of the circuit board 12.

Figure 9:
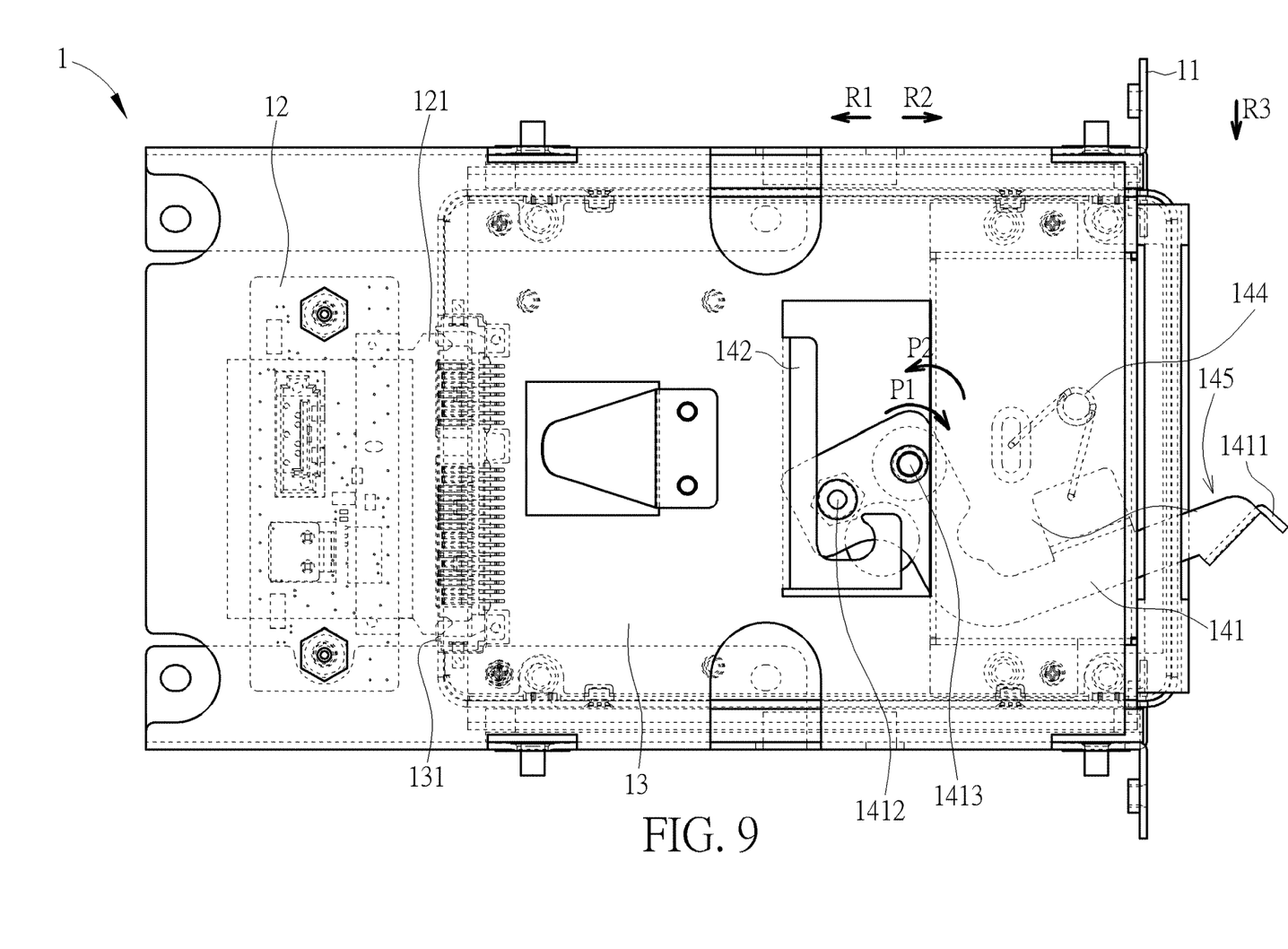

When the electronic device 1 is in a state shown in FIG. 8, the electrical connector 131 of the detachable module 13 and the mating electrical connector 121 of the circuit board 12 are disengaged from each other. At this movement, as long as the lever component 141 continuously pivots along the first pivoting direction P1 to leave from the position shown in FIG. 8, i.e., as long as the lever component 141 pivots along the first pivoting direction P1 over the predetermined degree, the resilient force provided by the resilient component 144 can apply a moment on the lever component 141 along the first pivoting direction P1, so that the lever component 141 can be driven by the resilient component 144 to pivot to a position as shown in FIG. 9 along the first pivoting direction P1 continuously. In other words, after the operating portion 1411 is operated by the user to pivot to a releasing position between the position shown in FIG. 8 and the position shown in FIG. 9, the user can release the operating portion 1411 to allow the resilient component to drive the lever component 141 to continuously pivot from the releasing position to the position shown in FIG. 9.

Figure 10:
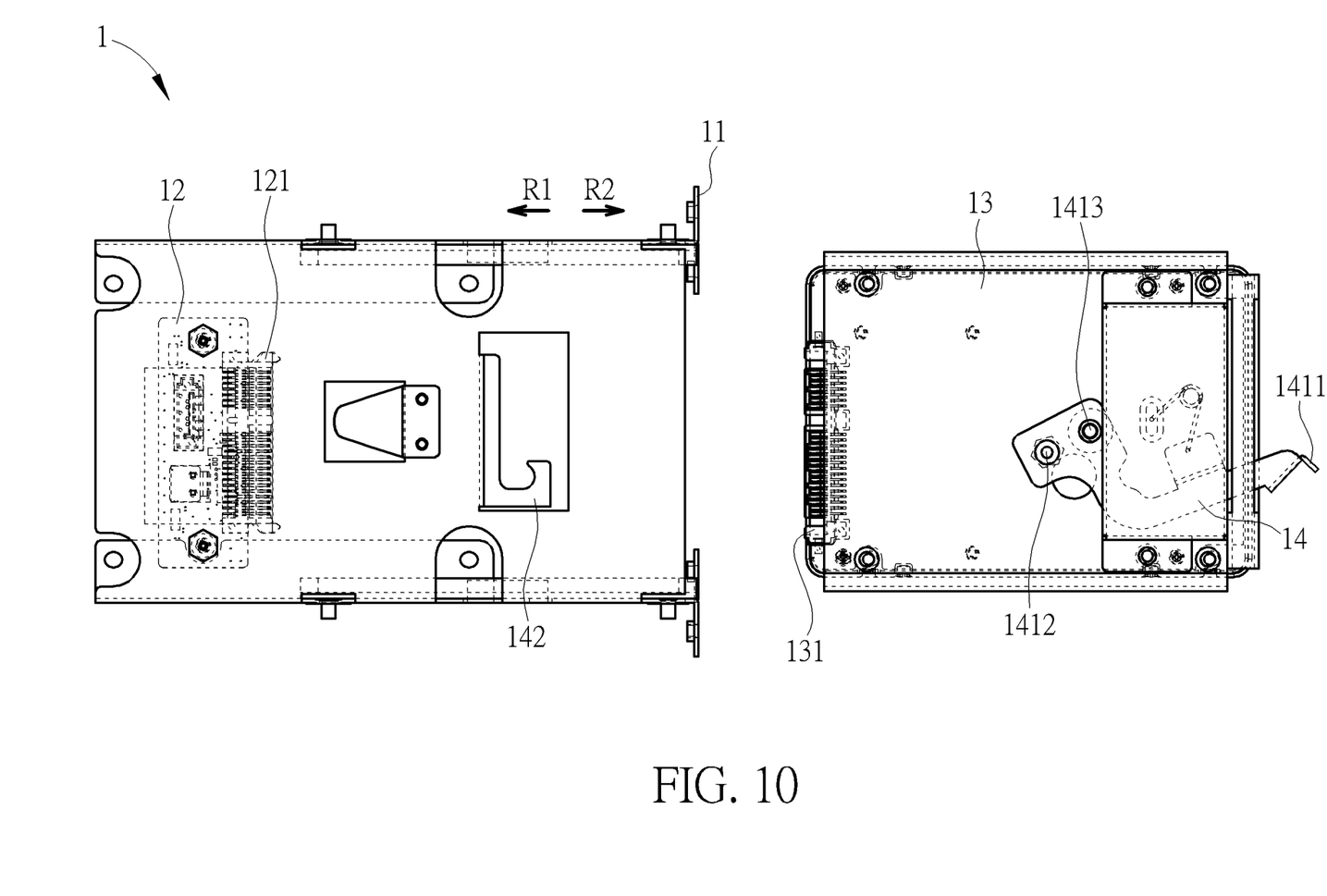

It should be noticed that when the electronic device 1 is in a state shown in FIG. 9, an accommodating space 145 is formed between the operating portion 1411 of the lever component 141 and the lateral plate component 143, so that the user can insert a finger or a tool into the accommodating space 145 to draw out the detachable module 13 to locate the electronic device 1 in a state shown in FIG. 10.

On the other hand, when it is desired to install the detachable module 13 on/into the case module 11, the detachable module 13, the lateral plate component 143 and the lever component 141 can be operated together to slide into the case module 11, i.e., the electronic device 1 is switched from the state shown in FIG. 10 to the state shown in FIG. 9, so that the lever component 141 can be driven by the abutment of the abutting portion 1412 and the abutting component 142 to pivot along a second pivoting direction P2 opposite to the first pivoting direction P1, so as to locate the electronic device 1 in a state shown in FIG. 6, wherein the detachable module 13 is located at the engaging position, and the electrical connector 131 of the detachable module 13 and the mating electrical connector 121 of the circuit board 12 are mated with each other. In other words, during assembly of the detachable module 13, it is not required to operate the lever component 141, which brings convenience in use.

However, the present invention is not limited to this embodiment. For example, in another embodiment, the lateral plate component can be omitted, i.e., the lever component can be directly pivoted to the detachable module and extend toward the front side of the detachable module to be exposed out of the front side of the detachable module. Alternatively, in another embodiment, the resilient component for driving the lever component by the resilient force can be omitted. Alternatively, in another embodiment, the guiding component for guiding the sliding movement of the detachable module can be omitted. Furthermore, shapes of the lever component and the abutting components are not limited to this embodiment. It depends on practical demands. Any mechanism, which allows the detachable module to be directly or indirectly driven by the abutment of the lever component and the abutting component to slide along the second direction to disengage the electrical connector of the detachable module from the mating electrical connector of the circuit board, is included within the scope of the present invention.

In contrast to the prior art, the present invention utilizes the lever component partially exposed out of the front side of the detachable module and partially located between the detachable module and the case module to abut against the abutting component for driving the electrical connector of the detachable module to disengage from the mating electrical connector of the circuit board. During the aforementioned operation, a resistance arm, i.e., the straight line distance between the pivoting portion and the abutting portion, is less than a force arm, i.e., the straight line distance between the pivoting portion and the operating portion, and the resilient component can provide the resilient force to drive the lever component to pivot along the first pivoting direction continuously after the lever component pivots along the first pivoting direction over the predetermined degree. Therefore, the present invention has advantages of easy and effort-saving operation. Besides, the present invention has simple structure, which does not affect the outward appearance and internal space arrangement, and therefore the present invention has an enhanced overall aesthetic appearance and facilitates miniaturization and thinning of the electronic device. Furthermore, during assembly of the detachable module, it is not required to operate the lever component, which brings convenience in use.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An electronic device with capability of lever ejection comprising:
   a case module;
   at least one circuit board installed on the case module;
   at least one detachable module detachably installed on the case module and slidable relative to the case module to an engaging position along a first direction, an electrical connector of the at least one detachable module being mated with an mating electrical connector of the at least one circuit board when the at least one detachable module is located at the engaging position; and
   at least one lever mechanism for driving the at least one detachable module to slide relative to the case module along a second direction opposite to the first direction, the at least one lever mechanism comprising:
      a lever component comprising:
         an operating portion exposed out of a front side of the at least one detachable module;
         an abutting portion located between the at least one detachable module and the case module; and
         a pivoting portion fixedly connected to the operating portion and the abutting portion and located between the operating portion and the abutting portion, the pivoting portion being pivotally disposed on a lateral side of the at least one detachable module adjacent to the front side of the at least one detachable module;
      an abutting component fixed on the case module and located at a position corresponding to the abutting portion for abutting against the abutting portion; and
      a resilient component, an end of the resilient component being connected to the lever component, the resilient component providing a resilient force to drive the lever component to pivot along the first pivoting direction continuously after the lever component pivots along the first pivoting direction over a predetermined degree;
   wherein when the operating portion of the lever component is operated to drive the lever component to pivot relative to the at least one detachable module along a first pivoting direction, the abutting portion abuts against the abutting component to drive the at least one detachable module to slide along the second direction to a disengaging position, so that the electrical connector of the at least one detachable module is disengaged from the mating electrical connector of the at least one circuit board.

2. The electronic device of claim 1, wherein the at least one lever mechanism further comprises a lateral plate component disposed on the lateral side of the at least one detachable module, and the lever component is pivoted to the lateral plate component.

3. The electronic device of claim 2, wherein another end of the resilient component is connected to the lateral plate component.

4. The electronic device of claim 3, further comprising at least one guiding component fixed on the case module and located at a position corresponding to the lateral plate component, the lateral plate component slidably cooperating with the at least one guiding component to guide the at least one detachable module to slide relative to the case module along the first direction or the second direction.

5. The electronic device of claim 2, further comprising at least one guiding component fixed on the case module and located at a position corresponding to the lateral plate component, the lateral plate component slidably cooperating with the at least one guiding component to guide the at least one detachable module to slide relative to the case module along the first direction or the second direction.

6. The electronic device of claim 1, wherein the lever component is pivoted to the at least one detachable module.

7. The electronic device of claim 6, wherein another end of the resilient component is connected to the at least one detachable module.

8. The electronic device of claim 1, wherein the operating portion, the abutting portion and the pivoting portion are integrally formed.

9. The electronic device of claim 8, wherein a straight line distance between the pivoting portion and the abutting portion is less than a straight line distance between the pivoting portion and the operating portion.

10. The electronic device of claim 1, wherein a straight line distance between the pivoting portion and the abutting portion is less than a straight line distance between the pivoting portion and the operating portion.

11. A lever mechanism adapted for a detachable module detachably installed on a case module, the detachable module being slidable relative to the case module along a first direction to an engaging position, an electrical connector of the detachable module being mated with a mating electrical connector of a circuit board installed on the case module, the lever mechanism comprising:
    a lever component comprising:
        an operating portion exposed out of a front side of the detachable module;
        an abutting portion located between the detachable module and the case module; and
        a pivoting portion fixedly connected to the operating portion and the abutting portion and located between the operating portion and the abutting portion, the pivoting portion being pivotally disposed on a lateral side of the detachable module adjacent to the front side of the detachable module;
    an abutting component fixed on the case module and located at a position corresponding to the abutting portion for abutting against the abutting portion; and
    a resilient component, an end of the resilient component being connected to the lever component, the resilient component providing a resilient force to drive the lever component to pivot along the first pivoting direction continuously after the lever component pivots along the first pivoting direction over a predetermined degree;
    wherein when the operating portion of the lever component is operated to drive the lever component to pivot relative to the detachable module along a first pivoting direction, the abutting portion abuts against the abutting component to drive the detachable module to slide along a second direction to a disengaging position, so that the electrical connector of the detachable module is disengaged from the mating electrical connector of the circuit board.

12. The lever mechanism of claim 11, further comprising a lateral plate component disposed on the lateral side of the detachable module, and the lever component being pivoted to the lateral plate component.

13. The lever mechanism of claim 12, wherein another end of the resilient component is connected to the lateral plate component.

14. The lever mechanism of claim 13, wherein the lateral plate component slidably cooperates with at least one guiding component of an electronic device to guide the detachable module to slide relative to the case module along the first direction or the second direction.

15. The lever mechanism of claim 12, wherein the lateral plate component slidably cooperates with at least one guiding component of an electronic device to guide the detachable module to slide relative to the case module along the first direction or the second direction.

16. The lever mechanism of claim 11, wherein the lever component is pivoted to the detachable module.

17. The lever mechanism of claim 16, wherein another end of the resilient component is connected to the detachable module.

18. The lever mechanism of claim 11, wherein the operating portion, the abutting portion and the pivoting portion are integrally formed.

19. The lever mechanism of claim 18, wherein a straight line distance between the pivoting portion and the abutting portion is less than a straight line distance between the pivoting portion and the operating portion.

20. The lever mechanism of claim 11, wherein a straight line distance between the pivoting portion and the abutting portion is less than a straight line distance between the pivoting portion and the operating portion.

* * * * *